US012068024B2

(12) United States Patent
Chesavage et al.

(10) Patent No.: US 12,068,024 B2
(45) Date of Patent: *Aug. 20, 2024

(54) ADDRESS DEPENDENT WORDLINE TIMING IN ASYNCHRONOUS STATIC RANDOM ACCESS MEMORY

(71) Applicant: Ceremorphic, Inc., San Jose, CA (US)

(72) Inventors: Jay A. Chesavage, Palo Alto, CA (US); Robert Wiser, Palo Alto, CA (US); Neelam Surana, Palaj (IN)

(73) Assignee: Ceremorphic, Inc., San Jose, CA (US)

( * ) Notice: Subject to any disclaimer, the term of this patent is extended or adjusted under 35 U.S.C. 154(b) by 154 days.

This patent is subject to a terminal disclaimer.

(21) Appl. No.: 17/734,045

(22) Filed: Apr. 30, 2022

(65) Prior Publication Data

US 2023/0352082 A1    Nov. 2, 2023

(51) Int. Cl.
*G11C 11/408* (2006.01)
*G11C 11/4093* (2006.01)
*G11C 11/4094* (2006.01)
*G11C 11/4096* (2006.01)

(52) U.S. Cl.
CPC ...... *G11C 11/4096* (2013.01); *G11C 11/4085* (2013.01); *G11C 11/4093* (2013.01); *G11C 11/4094* (2013.01)

(58) Field of Classification Search
CPC ..... G11C 11/418; G11C 7/062; G11C 11/419; G11C 5/063; G11C 7/1069; G11C 11/413; G11C 7/1006; G11C 7/1039; G11C 7/1048
See application file for complete search history.

(56) References Cited

U.S. PATENT DOCUMENTS

| 7,516,280 | B1 | 4/2009 | Rezeanu |
| 2002/0159285 | A1 | 10/2002 | Morley et al. |
| 2006/0171216 | A1* | 8/2006 | Byun .................. G11C 11/4085 365/194 |
| 2006/0176743 | A1 | 8/2006 | Bunce et al. |

(Continued)

OTHER PUBLICATIONS

Search Report, PCT/US2022/053414.

(Continued)

*Primary Examiner* — Khamdan N. Alrobaie
(74) *Attorney, Agent, or Firm* — File-EE-Patents.com; Jay A. Chesavage (57) ABSTRACT

A static random access memory (SRAM) has one or more arrays of memory cells, each array of memory cells activated in columns by a wordline. The activated column of memory cells asserts output data onto a plurality of bitlines coupled to output drivers. The SRAM includes a wordline controller generating a variable pulse width wordline which may be reduced sufficient to introduce memory read errors. Each of a high error rate, medium error rate, low error rate, and error-free rate is associated with a pulse width value generated by the wordline controller. A power consumption tradeoff exists between the wordline pulse width and consumed SRAM power. The wordline controller is thereby able to associate a wordline pulse width to an associated error rate for performing tasks which are insensitive to a high error rate or a medium error rate, which are specific to certain neural network training and inference using various NN data types.

17 Claims, 8 Drawing Sheets

(56) References Cited

U.S. PATENT DOCUMENTS

| | | | |
|---|---|---|---|
| 2009/0158101 A1* | 6/2009 | Abu-Rahma | G11C 8/08 |
| | | | 714/E11.002 |
| 2011/0242912 A1* | 10/2011 | Kang | G11C 7/222 |
| | | | 365/194 |
| 2013/0176784 A1 | 7/2013 | Cometti et al. | |
| 2013/0301335 A1 | 11/2013 | Ong | |
| 2016/0099059 A1 | 4/2016 | Chen et al. | |
| 2016/0148680 A1 | 5/2016 | Yoshimoto et al. | |
| 2018/0068709 A1* | 3/2018 | Baek | G11C 7/222 |

OTHER PUBLICATIONS

Yang et al "A double sensing scheme with selective bitline voltage regulation for ultralow voltage iming speculative SRAM", IEEE Jounral of Solid-State Circuits 53.8 (2018) p. 2415-2426.

* cited by examiner

Figure 1A
Memory Cell Array with Longest Wordline Signal Path

Figure 1B
Memory Cell Array with Shortest Wordline Signal Path

Figure 2
Word Line Waveform vs Address Accessed

Figure 3
Wordline/Dataline Delay vs Address

Figure 4

Case 1: high bit error tolerable ~10%MSB (training NN w/lg dataset)
Case 2: moderate bit error rate ~1% MSB (audio NN)
Case 3: low bit error rate ~0.1% MSB errors acceptable (Imagenet NN)
Case 4: no errors tolerable (<~0.00034%)

*Figure 5*
Wordline Pulse Width Controller

*Figure 6*

*Figure 7*
Wordline Pulse Width/Error Rate Association Flowchart

Figure 8A Wordline Pulse Width Controller and address-independent error rate

Figure 8B Wordline Timing Controller

Figure 8C
Wordline Pulse Width Controller with address-independent error rate
Long Wordline Data Access (A[31:30] = [11] & high err)

Figure 8D
Wordline Pulse Width Controller with address-independent error rate
Long Wordline Data Access (A[31:30] = [11] & Low Err)

Figure 8E
Wordline Pulse Width Controller with address-independent error rate
Short Wordline Data Access (A[31:30] = [00] & high err)

Figure 8F
Wordline Pulse Width Controller with address-independent error rate
Short Wordline Data Access (A[31:30] = [00] & low err)

Figure 9A
Error Rate vs Address

Figure 9B
Access time vs Address

ADDRESS DEPENDENT WORDLINE TIMING IN ASYNCHRONOUS STATIC RANDOM ACCESS MEMORY

FIELD OF THE INVENTION

The present invention relates to a controller for a Static Random Access Memory (SRAM). In particular, the invention relates to adjustment of timing in an SRAM to provide reduced power consumption by use of a minimum wordline signal pulse width on a data processing application specific basis.

BACKGROUND OF THE INVENTION

A chip layout for a Static Random Access Memory (SRAM) is typically arranged having a memory cell region comprising an array of memory cells for storing data, Input/Output (I/O) logic providing data input and output interfaces, and controller logic performing address decoding to enable memory cells of a selected column of memory cells in the memory cell array. When retrieving data from an SRAM, the controller causes a wordline signal to be activated, the activated wordline comprising a horizontal wordline connected to a vertical wordline which activates a vertical column of memory cells of the memory cell array, and the data from a selected vertical column of activated memory cells is transferred on a plurality of horizontal bitlines to the I/O logic and to output pins of the SRAM. The example vertical and horizontal components of the wordlines and horizontal bitlines, respectively, are arbitrary orientations for explanation purposes. A memory cell associated with a shortest length wordline signal path from a controller and a shortest length bitline path length from a memory cell has an access time which is faster than that of a memory cell associated with a longest length wordline signal path from the controller and a longest length bitline from a memory cell.

In prior art SRAM applications, the SRAM data is typically clocked through a series of pipeline stages. In these applications, the speed of the system is established by the slowest element response time, which establishes the clocking rate for the memory system. Further, these prior art data SRAM applications typically rely on error-free data accuracy, since the data being handled may be CPU instructions or data whose accuracy must be fully preserved when reading and writing, and having very low introduced error rates is not only essential, but the subject of many error detection and correction methods to ensure very high data accuracy.

A new type of processing system used in artificial intelligence networks and information processing architectures is known as a Neural Network (NN), and does not have these error-free data processing constraints. In certain NN applications, the data is handled asynchronously in independent stages, and does not rely on pipeline stage processing with fixed pipeline stage processing times governed by a system clock. Additionally, in certain processing applications such as image processing, because of the vast amount of data being processed by the NN, and the inherent random noise already present in the data, these NN applications may not require a high degree of accuracy in reading data, and are insensitive to random additional errors introduced by memory data retrieval errors with a noise variance smaller than the noise variance of the data used for training or inference. In other NN applications, the data precision requirement is low, and only the high order (most significant) bits of data are important or in use, and the low order (least significant) bits of data may be corrupted or lost without loss of accuracy of the inferences formed by the NN processor. However, prior art SRAMs do not provide flexibility in accuracy, but may have higher power consumption, neither of which would be helpful in certain neural network data processing applications.

A new memory architecture is desired which provides the ability to trade off memory access time with accuracy of retrieved data and power consumption, and to provide an arrangement of data in the memory array which provides incrementally greater accuracy for most significant bit data than for least significant bit data.

OBJECTS OF THE INVENTION

A first object of the invention is a memory array which provides a shorter wordline signal path from a controller for most significant bits (MSB) of a memory word than that for least significant bits (LSB) of the memory word, wherein a word is 16 bits or 32 bits, for example.

A second object of the invention is a memory array comprising:
  a top memory cell array accessed by activating a wordline signal path which causes the top memory cell array to output data onto one or more top array bitlines;
  a bottom memory cell array accessed by activating a wordline signal path which causes bottom memory cell array to output data onto one or more bottom array bitlines;
  a wordline controller configured to examine output data from the one or more bitlines, the wordline controller modifying a wordline signal pulse width until one of at least two distinct error states occur:
  a comparatively high error rate where an MSB of a memory cell has an error rate in the range of 2% to 15%, or approximately 10%;
  a comparatively moderate error rate where an MSB of a memory cell has an error rate in the range of 0.5% to 2%, or approximately 1%;
  a comparatively low error rate where an MSB of a memory cell has an error rate in the range of 0.005% to 0.5%, or approximately 0.1%
  a very low error rate where an MSB of a memory cell has an error rate less than 0.00034%.

A third object of the invention is a memory array with a selectable error rate and gradient of error rate such that an MSB has a lower error rate than an LSB for a given address, the memory array having approximately uniform error rate over a range of addresses, the memory array comprising:
  a top memory cell array accessed by activating a wordline signal which causes the top memory cell array to output data onto one or more bitlines;
  a bottom memory cell array accessed by activating a wordline signal which causes bottom memory cell array to output data onto one or more bitlines;
  an address controller configured to generate wordline signal outputs for associated addresses with a timing dependent on address value and maintaining an approximately constant error state across a range of addresses;
  a wordline controller configured to examine output data from the one or more bitlines, the wordline controller modifying a wordline signal pulse width responsive to an access address until at least two distinct error states occur:

a high error rate where an MSB of a memory cell has an error rate in the range of 2% to 15%, or approximately 10%;

a moderate error rate where an MSB of a memory cell has an error rate in the range of 0.5% to 2%, or approximately 1%;

a low error rate where an MSB of a memory cell has an error rate in the range of 0.005% to 0.5%, or approximately 0.1% a very low error rate where an MSB of a memory cell has an error rate less than 0.00034%.

A fourth object of the invention is a memory controller for a memory, the controller having a wordline driver outputs which are coupled to wordlines, each wordline having a wordline length, each wordline configured to enable a plurality of memory cells, each memory cell providing data coupled to an output through a respective bitline;

where each wordline has a wordline signal delay selected to approximately match a time delay associated with an associated wordline length;

and where corresponding bitline path lengths and/or wordline path lengths for high order (most significant) data bits have shorter length than bitlines and/or wordline path length for low order (least significant) data bits.

SUMMARY OF THE INVENTION

A static random access memory (SRAM) comprises at least one memory cell array whereby a memory cell array is activated by at least one wordline which is driven by a controller. The memory cell array has output bitlines where each activated memory cell asserts output data to an input/output (IO) controller, which provides the output data to an output port of the SRAM. The controller is configured to modify a pulse width of the at least one wordline until a particular output error rate is reached, where the output error rate may be selected to fall into at least two and preferably four or more ranges, such as a high error rate of approximately 10% error rate for an MSB of a memory cell, a medium error rate of approximately 1% for an MSB of a memory cell, approximately 0.1% for an MSB of a memory cell, and very low error rate which may be defined as less than six sigma (corresponding to an error rate less than 0.00034%). In one example of the invention, the memory cell array is configured such that a wordline signal path has a shortest length from a controller source to a memory cell column for low memory address such as 0x0000 (0x prefix indicating hexadecimal notation), and a longest path length for a high memory address such as 0xFFFF for a 64K 32 bit word memory of the present examples. In another example of the invention, the activation of a memory cell by the wordline signal results in the memory cell providing a plurality of bitlines carrying the memory cell output data, where the memory bits are assigned such that a bitline for an MSB is shorter than a bitline for a corresponding LSB of the same memory address.

A wordline driver has a variable pulse width control line, such that the pulse width of an activation signal carried by the wordline can be shortened to reduce power consumption of the memory in exchange for increased error rate, and the wordline signal driver can be configured to provide a high error rate, medium error rate, low error rate, or very low error rate operation in exchange for memory speed and power consumption. A calibration routine is provided which enables the association of a wordline signal pulse width for each of the associated error rates.

The previously described embodiment provides data with an error rate which increases with wordline path length, since the synchronous clock cycles are of fixed intervals regardless of wordline path length.

Another embodiment of the invention for use in an asynchronous memory system comprises a memory controller configured to provide an approximately uniform and selectable data error rate from among a plurality of data error rates. In this embodiment, the most significant bits of a requested address are used in combination with an associated wordline path length (or data valid time for an associated data error rate) to assert data which satisfies the selected data error rate across all address values by compensating for the delay in wordline signal path length (associated with the requested address) by delivering data associated with an address having a shorter wordline length than data associated with an address having a longer wordline signal path length. This approach maintains the earlier aspect where the output data has lower rate of MSB errors than LSB errors by arrangement of data MSB with shorter wordline signal path and/or bitline signal path lengths than corresponding data LSB. This alternative embodiment maintains the advantages of lower power consumption and earlier data delivery than conventional SRAM.

DETAILED DESCRIPTION OF THE INVENTION

In the present application, like reference numbers refer to like structures. References to "approximately" a nominal value are understood to be in the range of ⅕th of the nominal value to 5× the nominal value. References to "on the order of" a nominal value are understood to be in the range of 1/10th of the nominal value to 10× the nominal value. Other values such as 200 ps wordline signal delay over address ranges and 20 ps wordline signal delay across data bits are for example use only, and depend on the address and data size of the memory, as well as physical layout.

Figure 1A:
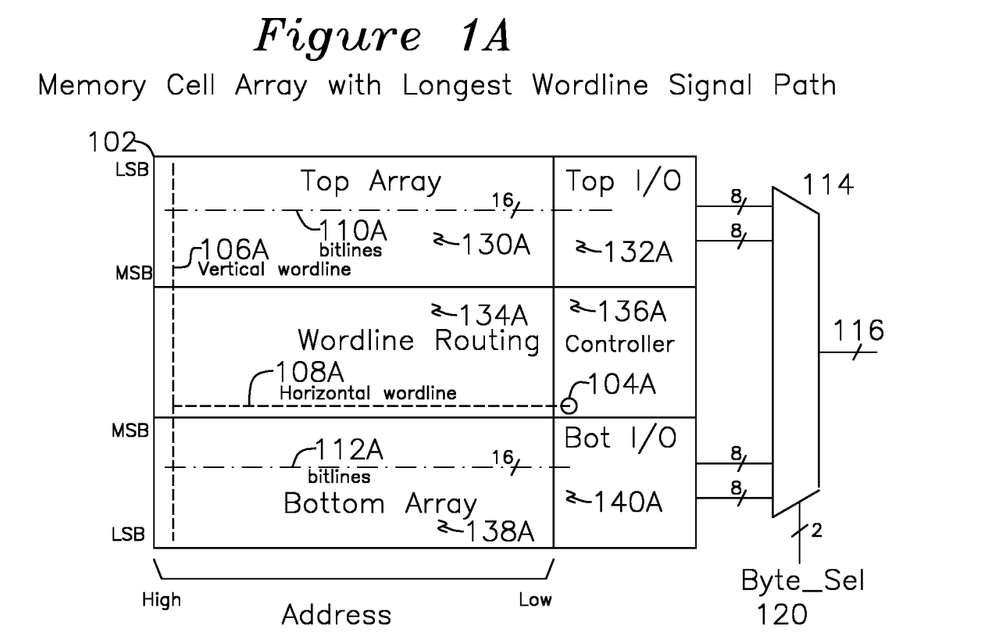
FIG. 1A is a plan view of a memory cell array with IO, controller, and wordline routing area, showing a longest wordline signal path length.

FIG. 1A shows an example memory cell array 102 in an example chip layout, where a top memory cell array 130A and a bottom memory cell array 138A each comprise columns of Static Random Access Memory (SRAM) memory cells. Each memory cell in the top or bottom memory cell arrays is arranged by sequential address in sequential columns, and each address of the memory corresponds to a column which is activated by a respective wordline 108/106 driven by controller 136A, which converts an applied address (not shown) to a particular column. Each wordline signal from the controller 136 is carried by a wordline in wordline routing region 134A comprising a horizontal wordline leading to a corresponding vertical wordline to the respective memory cell column. Each column of memory cells of the top and bottom memory cell arrays is activated by a particular wordline (108A to 106A), provides its output data by driving a plurality of bitlines 110A/112A, which deliver associated output data for the selected column of memory cells corresponding to the applied address to top I/O drivers 132A and bottom I/O drivers 140A, which deliver data shown as four 8 bit bytes to multiplexer 114 which may provide the output data in selectable bytes as data output 116 and selectable by Byte_Sel 120 input to multiplexer 114. The wordlines are individually driven by a controller 136A and enabled according to an applied address.

Figure 1B:
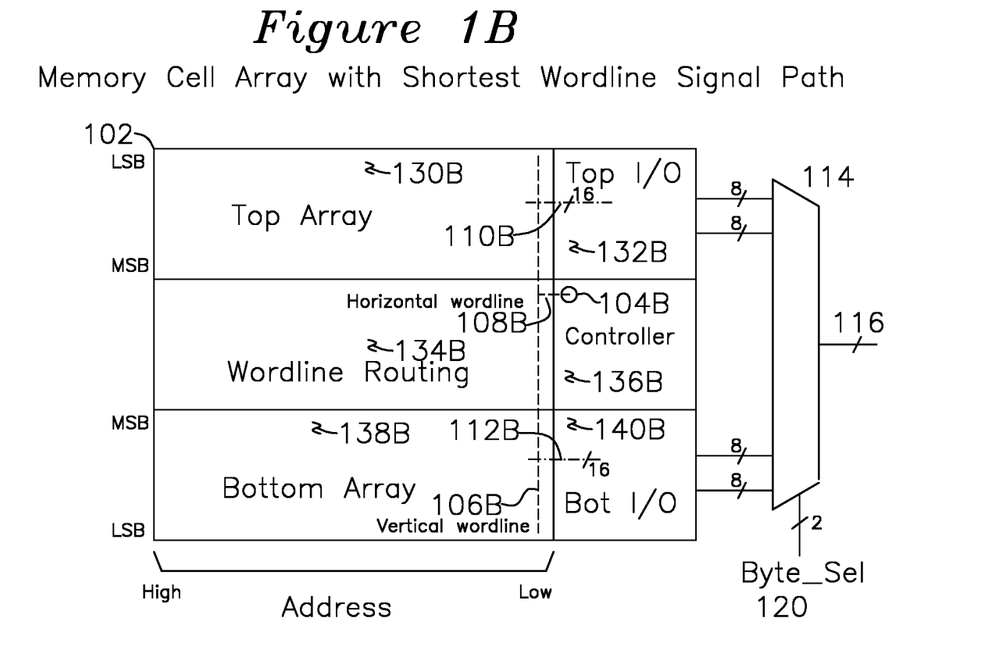
FIG. 1B is a plan view of a memory cell array with IO, controller, and wordline routing area, showing a shortest wordline signal path length.

FIG. 1A shows an example for a particular arrangement of data, where low address memory cells are located on the right side of memory arrays 130B and 138B, and high address memory cells are on the left side of memory array 130B and 138B with wordline routing region 134B distributing wordline signals. In this example arrangement, the longest wordline signal path (108A+106A) is associated with a high address such as 0xFFFF, and FIG. 1B shows an example shortest wordline signal path (108B+106B) for a low address such as 0x0000. In the longest wordline signal path example of FIG. 1A, controller output 104A drives wordline 108A to the high address memory column furthest from the controller output 104A, with wordline 106A transferring the memory column enable signal to a corresponding column of memory cells, the outputs of which are taken as an example 32 bits (four bytes) as two pairs of bytes from each of the top memory array 130A/B and bottom memory arrays 138A/138B. The top memory array cells 130A drive bitlines 110A and the bottom memory array cells 138A drive bitlines 112A. The data bits and associated bitlines for an enabled wordline column (106A/106B) are arranged with the MSB closest to the innermost control area (136A) and the LSB furthest from the innermost control area (136A), thereby having comparatively longer bitline 106B path length. Accordingly, the MSB for any given selected memory cell has an incrementally shorter wordline signal path length+bitline signal path length than an LSB for any given memory address. FIG. 1B shows a shortest wordline signal path length example for a low value address, where controller output 104B drives comparatively short path length wordline 108B to column wordline 106B to a respective column of low address value memory cells. The outputs of the memory cells are transferred via bitlines 110B and 112B to top I/O drivers 132B bottom I/O drivers 140B, which drive the example 32 bit output mux 114 for byte selection 120, as was also shown in FIG. 1A. Accordingly, low address values (0x0000) have a comparatively shorter wordline path length then high address values (0xFFFF), and for any given selected columns of memory cells, the wordline+bitline path length for a most significant data bit is shorter than for a corresponding least significant data bit of the selected column of memory cells.

Figure 2:
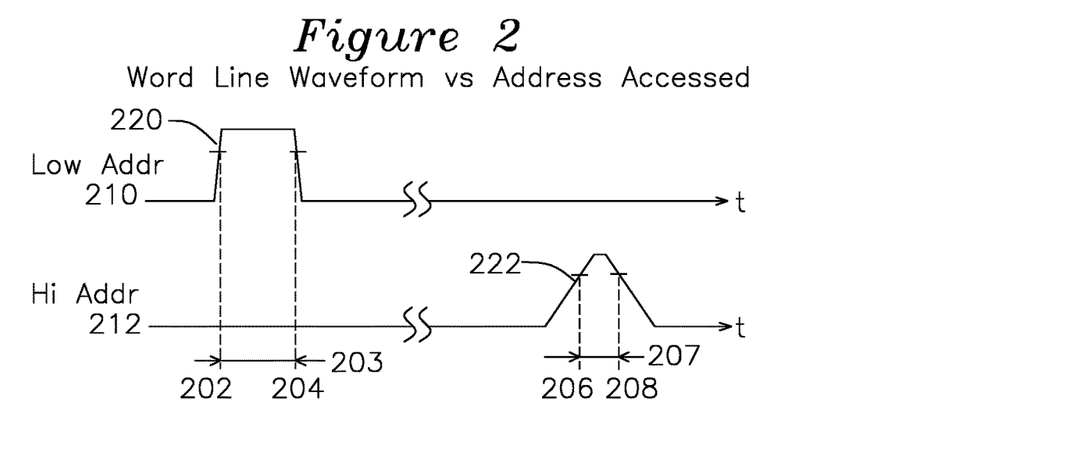
FIG. 2 is a plot for a wordline waveform for a low address and short wordline path length in comparison with a wordline signal waveform for a high address and long wordline path length.

FIG. 2 shows a plot of wordline waveform signal integrity as delivered to a low value address memory cell, where wordline waveform 210 with shortest wordline path length to the memory cell array has comparatively fast risetimes 220 and a pulse width 203 from turn on 202 to turn off 204. Waveform 212 shows an example wordline signal plot received by a distant memory cell associated with a high address value, and longest wordline signal path length, where the slew rate 222 is reduced from an RC time constant formed by the distributed wordline path electrical resistance and capacitance from driver to memory cell, and drive current to the wordline, resulting in reduced activation signal duration 207 from turn on 206 to turn off 208. The reduced activation time 207 for a remote (high address value) memory cell column compared to a nearby (low address value) memory cell with comparatively longer activation time 203 means that the selection of the wordline signal pulse width (activation duration) for the memory would be governed by worst case signal pulse width 207 for error-free operation, and signal pulse width 203 would be correspondingly greater, while causing unnecessary incremental power consumption but little other benefit.

Figure 3:
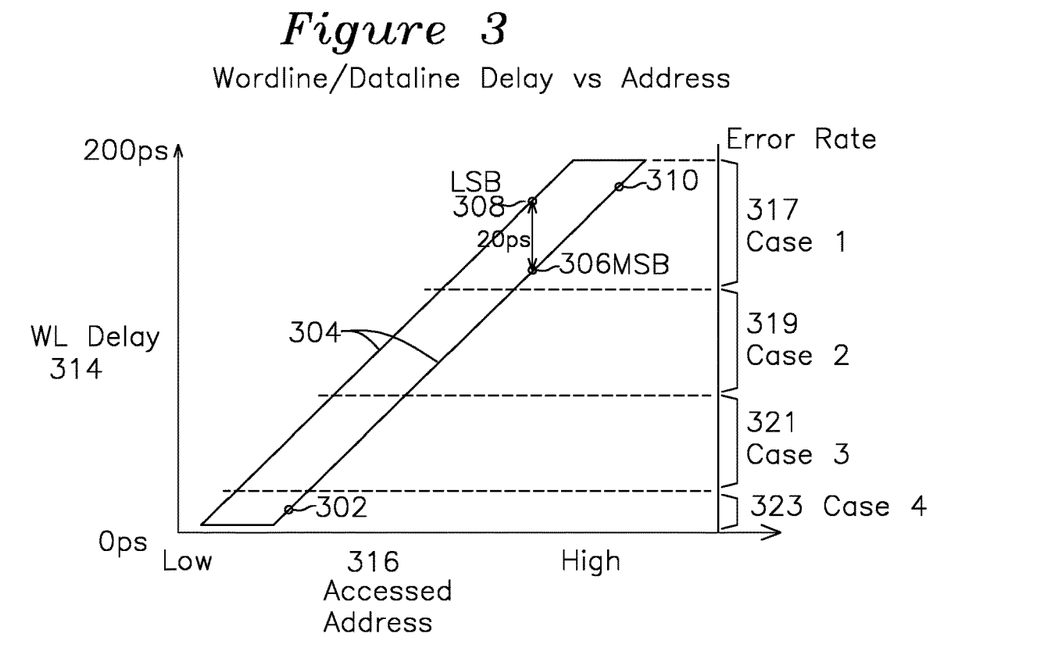
FIG. 3 is a plot of wordline signal path delay vs address which includes a bitline signal path delay associated with bit position for each memory address.

FIG. 3 shows a plot 304 of an example wordline signal delay 314 vs accessed memory address 316 with the lower and upper lines indicating associated wordline signal delay from a low address value (0x0000) to a high address value (0xFFFF). Plot 304 is trapezoidal to also show the variation in access time associated with a MSB 306 compared to LSB 308 for each given memory address, corresponding to the MSB/LSB bitline paths of FIGS. 1A and 1B. The plotted line 304 passing through LSB point 308 may represent the wordline signal delays for the LSB of the address range, where the lower wordline delays of the line passing through points 302, 306, and 310 may represent the wordline signal delays for the MSB of the associated address, with the other intermediate data bits being linearly arranged vertically according to bit significance. Note from the layout of FIGS. 1A and 1B that for a 32 bit word, the "MSB" and "LSB" bits are arranged as two 16 bit values with b0 and b16 as "LSB" and b15 and b31 as "MSB" by position. In an alternative arrangement, the data bits are arranged by wordline signal path length, such that the wordline column of [b31:b0] is physically arranged as [b31 b15 b30 b14 b29 b13 b28 b12 b27 b11 b26 b10 b25 b9 b24 b8 b23 b7 b22 b6 b21 b5 b20 b4 b19 b3 b18 b2 b17 b1 b16 b0], with b31 from upper array and b15 from lower array with shortest wordline signal path distances, and b16 from upper array and b0 from lower array having longest wordline signal path distances from source to I/O, as shown in FIGS. 1A and 1B.

Figure 4:
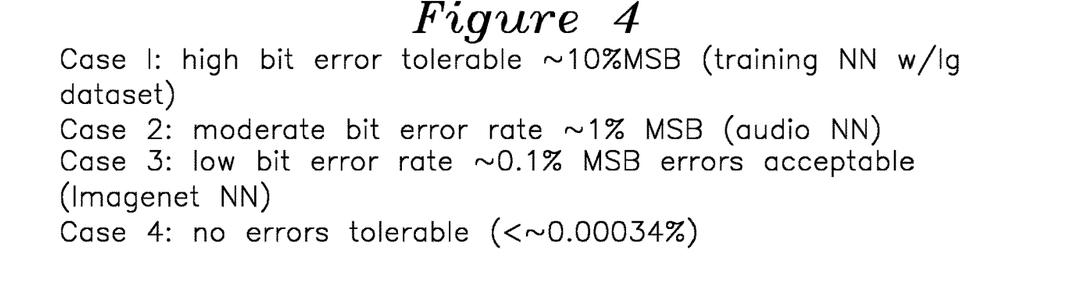
FIG. 4 provides examples for four error rates which may be associated with wordline signal active pulse width and example applications for the associated error rates.

FIG. 4 shows four example cases for error rates, case 1 being a high error rate such as 10% MSB error rate for training neural network data with a large dataset (range 317 of FIG. 3), case 2 being a moderate MSB bit error rate (319 of FIG. 3), such as forming neural network inferences from an audio data stream or noisy image data, case 3 being a low MSB bit error rate (321 of FIG. 3), or alternatively a bit error rate where the MSB has no bit errors and where only LSB errors are acceptable (such as training on the standard National Institute for Standards imagenet dataset available at NIST.gov), and case 4 where virtually no errors are tolerable on any bits (323 of FIG. 3), such as a six sigma error rate of less than 0.00034%.

Figure 5:
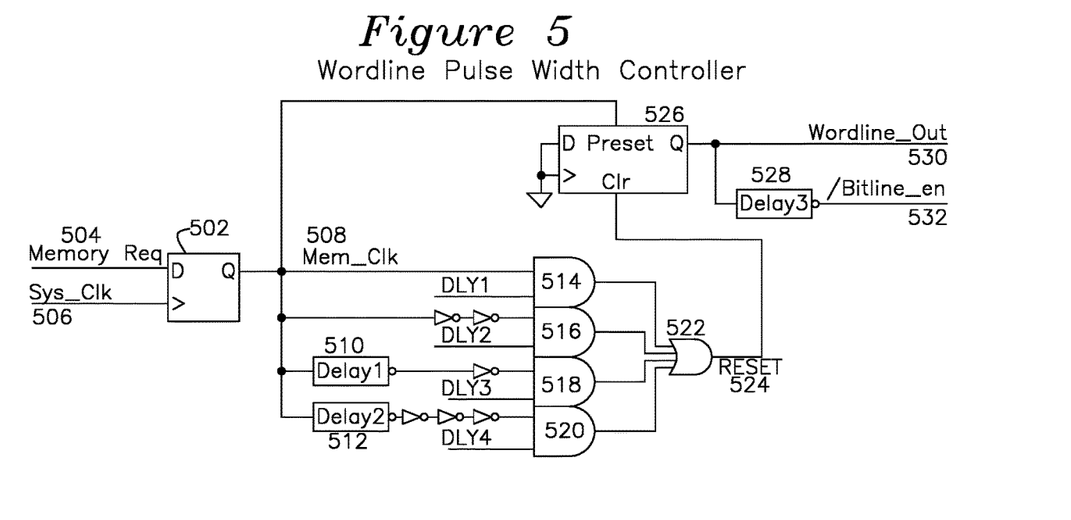
FIG. 5 is a schematic diagram example for a wordline signal pulse width controller having four selectable wordline pulse widths.
Figure 6:
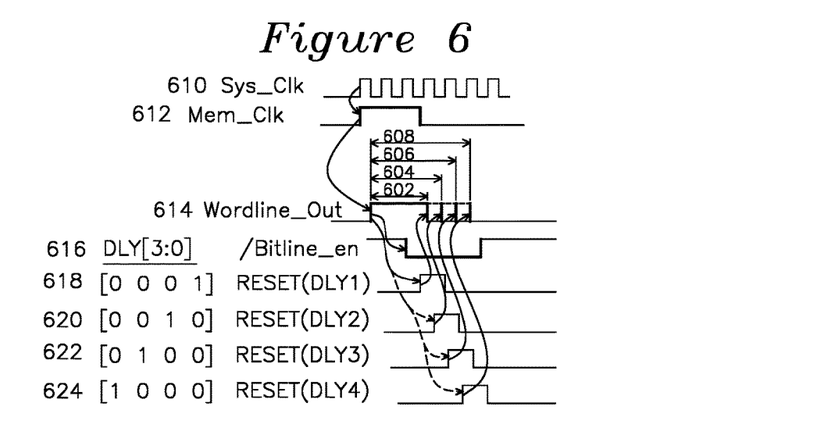
FIG. 6 are waveform plots for the four selectable wordline pulse widths of FIG. 5.

FIG. 5 shows an example wordline pulse width controller with associated waveforms shown in FIG. 6. A system clock 506 and memory request 504 may generate a Mem_Clk 508 signal from the assertion of a memory request 504, and MEM_CLK 508 presets D flip flop 526 to assert wordline out signal 530. The Mem_Clk 508 signal also is fed to AND gates 514, 516, 518, 520, each of which is individually enabled by binary delay select lines DLY1, DLY2, DLY3, DLY4, only one of which is asserted at a time, resulting in a variable length reset signal 524 which clears DFF 526 output to 0, de-asserting Wordline Out signal 530. The assertion of DLY1 has the shortest delay and results in the shortest Wordline Out signal activation time, and DLY2 assertion enables AND gate 516 and results in an incrementally greater delay associated with the two inverters at the input of AND gate 516. DLY3 enables AND gate 518 and provides an incrementally greater delay by the combined Delay 1 510 (with inverted output) and gate delay to input of AND gate 518, and DLY4 provides the longest delay associated with Delay2 512 plus three inverters driving AND gate 520. Accordingly, DLY4 may be associated with very low error rate wordline signal pulse width, DLY3 may be associated with low error rate pulse width, DLY2 with medium error rate pulse width, and DLY1 with a high error rate pulse width, according to the reduced wordline signal pulse width (activation time) associated with each, as shown in Wordline Out signal waveforms and associated DLY values 618, 620, 622, and 624, respectively, resulting in wordline signal pulse width (activation duration) 602, 604, 608, and 610, respectively. /Bitline_en signal 532 is the wordline out signal 530 with a bitline signal delay 538 to gate the selected output bits.

Figure 7:
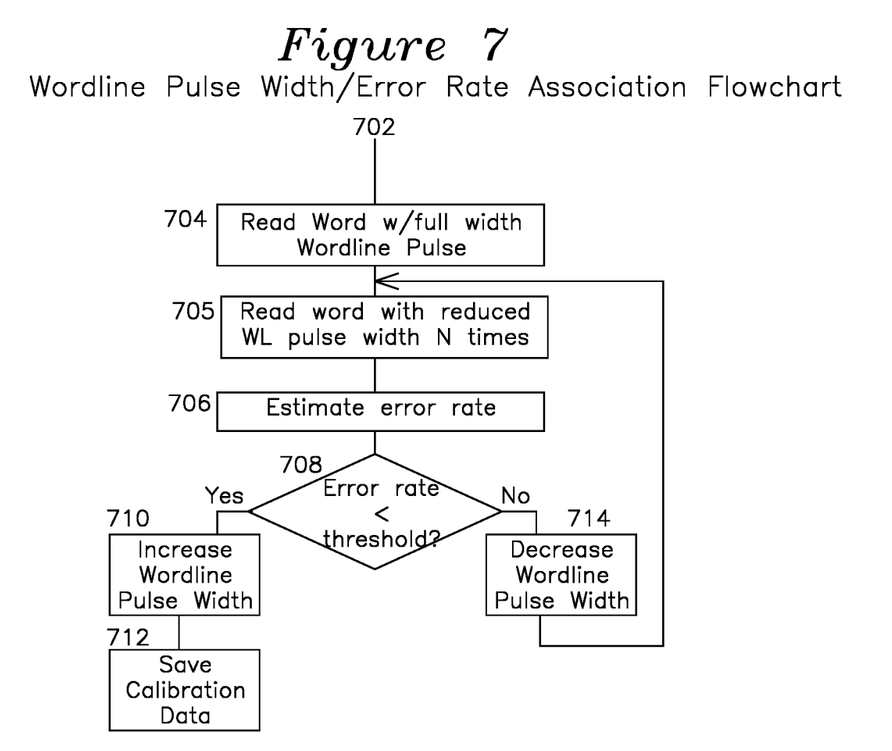
FIG. 7 is a flowchart for calibration of wordline delay with associated wordline pulse widths and associated error rates.

FIG. 7 shows an example error rate and wordline signal pulse width association flowchart. The wordline signal pulse width may be set to a maximum pulse width upon entry 702 such as DLY4 initially 704, and loop steps 705, 706, 708, and 714 result in the reading N times of a word in step 705 compared to a reference value stored in a controller register, followed by estimating an error rate 706, determining if the error rate for a given DLY value is lower than a threshold value 708, and decreasing the wordline signal pulse width 714 if so (such as by changing from DLY4 to DLY3 or DLY3 to DLY2, etc.), until the DLY [3:0] value associated with lowest wordline signal pulse width which satisfies a particular error rate is achieved, at which time the wordline signal pulse width may be optionally incremented by one DLY step for a safety margin to ensure an error rate which is no greater than the desired one, and the DLY value associated with a particular error rate is saved in step 712 for future reference. In this manner, each of the error rates such as the examples of FIG. 4 has an associated DLY value which may be used for the associated data types of FIG. 4. In another example of the invention, the various delays from Mem_Clk signal 508 to Reset 524 are provided with a fine grain delay which is then associated with an error rate threshold and adjusted in steps 710 and 714.

In another example of the invention, the error rates for a particular DLY value may increase with address value, since a fixed DLY value is associated with a particular data type. In this example, data associated with a lower error rate may be stored in low addresses and data associated with high error rates may be stored in high addresses. Similarly, it is preferable to arrange memory cells to have a shortest signal path length for the MSB and incrementally longer signal path lengths for an LSB in certain neural network applications, where LSB errors cause fewer inference errors than MSB errors.

The system of FIG. 5 is an example of a synchronous memory system operating synchronously with SYS_CLK 506. In other asynchronous memory applications not driven by a memory clock, it may be desired to make a request for memory data accompanied by an address, where the request is provided with a selectable fixed error rate in exchange for faster access for addresses associated with shorter wordline signal path lengths, and where the selected error rate is uniform across all addresses rather than increasing with associated address wordline length as was described in FIGS. 1A, 1B, and 3 for the controller of FIG. 5.

Figure 8A:
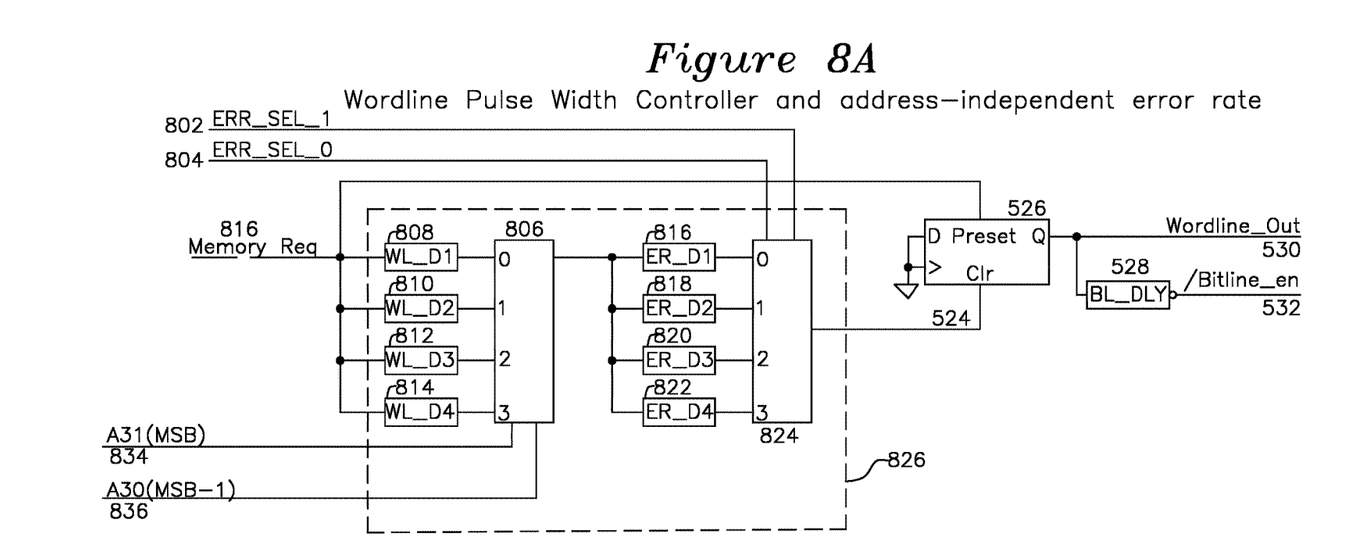
FIGS. 8A and 8B are block diagrams for a wordline signal pulse width controller having a selectable data error rate which is substantially uniform over an address range.

FIG. 8A shows an example asynchronous (clock-free) memory controller providing a selectable level of error rate over a range of addresses, while preserving a comparatively lower rate of MSB error compared to LSB of each given data word using the physical layout of FIGS. 1A and 1B. The desired error rate is selected using ERR_SEL_0 804 and ERR_SEL_1 802 which select a wordline signal delay associated with a fine adjustment of signal delay, and a course signal delay associated with wordline signal path length is selected using an address MSB 834 and address MSB-1 836, such as A31 and A30, respectively, for a 32 bit address. The combination of delays 808, 810, 812, 814 associated with wordline signal path delays corresponding to applied address, and error delays 816, 818, 820, 822 associated with fine adjustments to wordline signal path delays result in signal output 524 having an adjustable delay from Memory Req signal 816. The address-selected delay WL_D1 808, WL_D2 810, WL_D3 812, and WL_D4 814 are the wordline signal delays analogous to those of FIG. 5 providing a clear input 524 to DFF 526 as before, and generating wordline out signal 530 and/Bitline_en signal 532 as was described for FIG. 5. Most significant bits (MSB) of the address, shown as A31 834 and A30 836 in the present example are provided to select an associated signal delay with multiplexer 806 and multiplexer 824 performing a similar function for the error select inputs 802 and 804. The address delay inputs 834 and 836 may correspond to the amount of delay required to equalize the error rate over a respective address range, such as by providing the corresponding delay shown in plot 304. In this manner, the/bitline_en 532 output signal is valid at a time where the data has an approximately uniform error rate, while maintaining a greater error rate for LSB than MSB, and the error rate is uniform over the range of requested addresses.

Figure 8B:
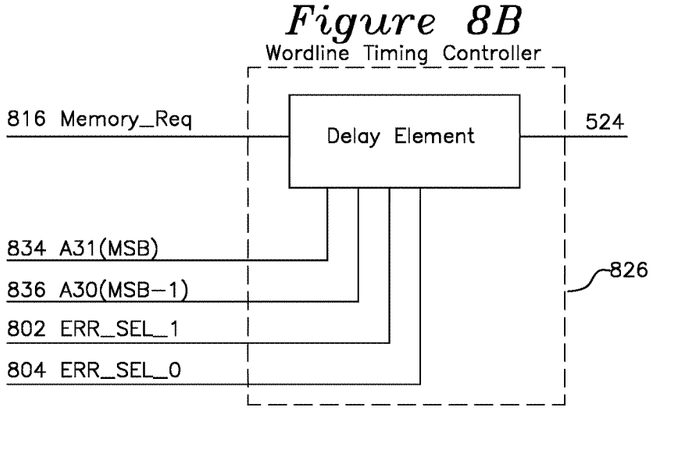

FIG. 8B shows a generalized delay element 826 where the inputs 834, 836, 802, and 804 associated with various delays may be realized using analog elements such as voltage controlled resistor and capacitor delay lines, digital gates, or other methods for achieving delays as required to satisfy the requirement for either constant error rate over a range of addresses, thereby providing a selectable error rate in exchange for earlier data delivery, or both, while maintaining comparatively greater data accuracy (lower data errors) of MSB data bits compared to LSB data bits.

Figure 8C:
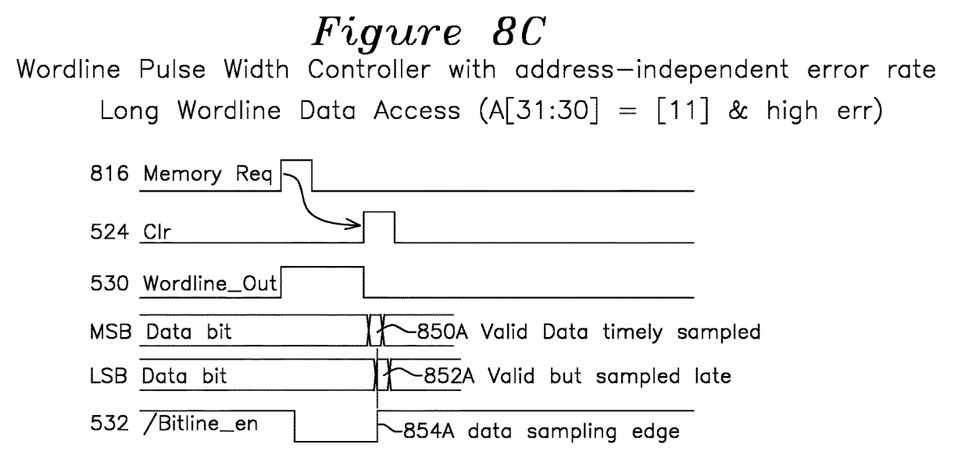
FIGS. 8C, 8D, 8E, and 8F are timing diagrams for various operating conditions.
Figure 8D:
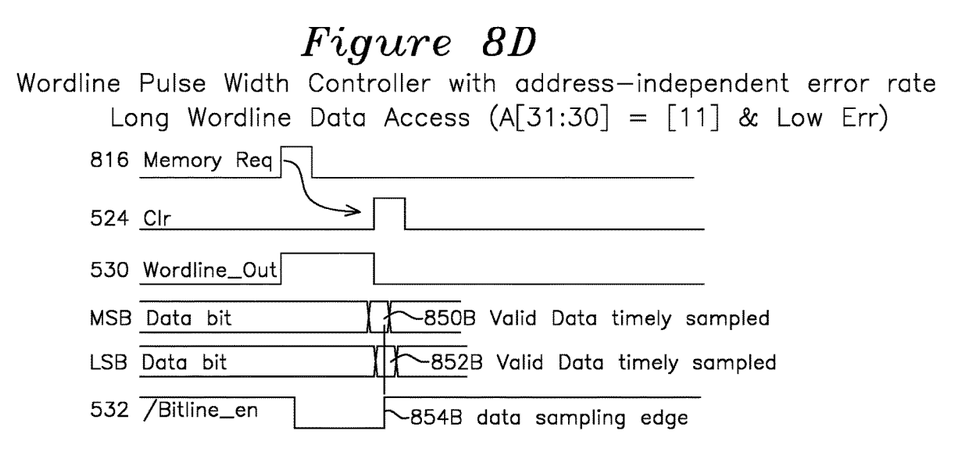
Figure 8E:
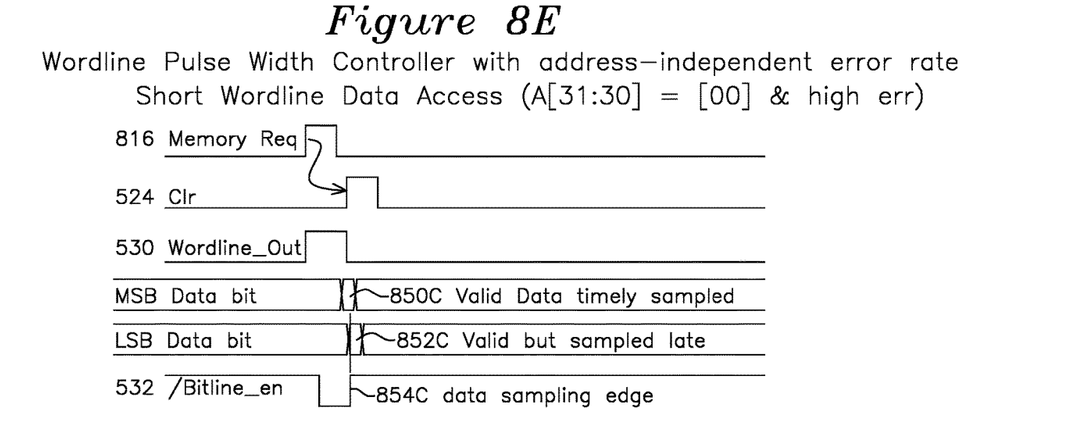
Figure 8F:
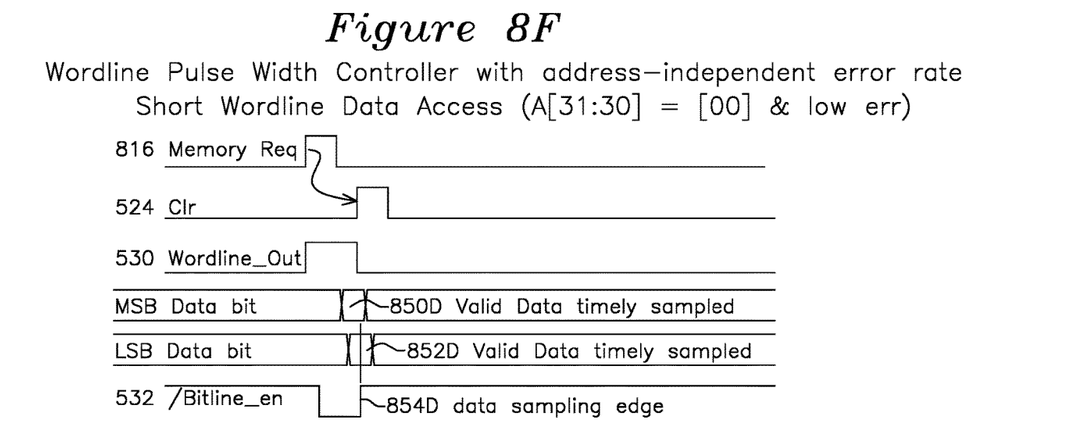

FIGS. 8C, 8D, 8E, and 8F show timing waveform diagrams for various operating conditions. FIGS. 8C and 8D show a high address (longest wordline path length) with high and low error rates, respectively. It can be seen that CLR signal 524 occurs earlier in FIG. 8C for faster data delivery, and provides waveform edge 854A to sample valid MSB 850A and invalid LSB 852, whereas FIG. 8D shows CLR signal 524 arriving later but provides delayed data sampling edge 854B providing valid MSB data 850B and valid LSB data 852B. FIGS. 8E and 8F similarly show waveform plots for low address timing diagram (A31 and A30 are 0), where the high data error input of 8E provides earlier data at data sampling edge 854C with valid MSB data 850C and invalid LSB data 852C, whereas low error delay of timing diagram 8F provides a sampling edge 854D at a later time, providing valid data for MSB and LSB, as shown by the sampling window 854D of 850D and 852D, respectively.

Figure 9A:
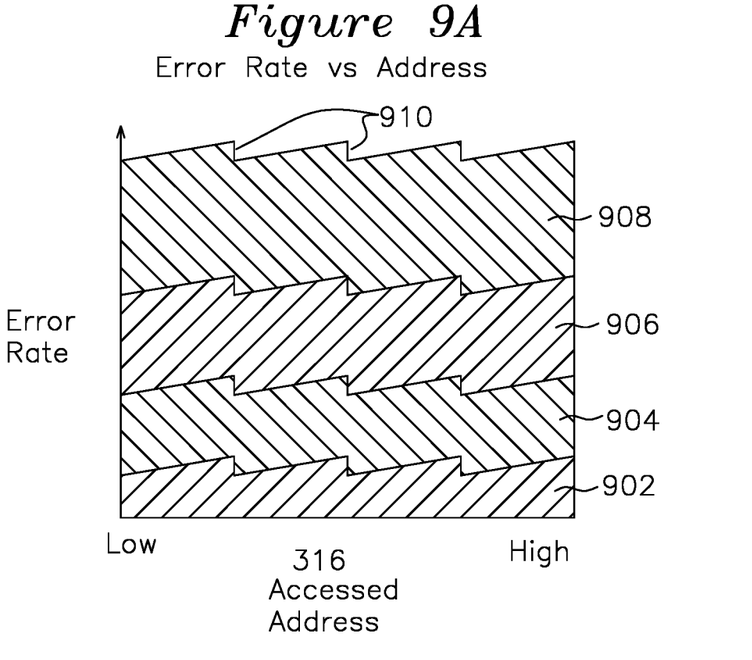
FIG. 9A is a plot of error rate vs address for four different error rates.

FIG. 9A shows an example plot of accessed address 316 vs error rate for the example controller of FIG. 8A or 8B, such that region 902 corresponds to the lowest error rate (case 4 as describe in FIG. 4), region 904 corresponds to a next higher error rate (case 3), region 906 is a next higher error rate (case 2) and region 902 corresponds to the highest error rate (case 1). The "sawtooth" 910 pattern of the error rate corresponds to the incremental wordline address increase which is mediated by each of the address-specific delays of address inputs A[31:30], such that the address space for two bits of address generate four ranges as shown.

Figure 9B:
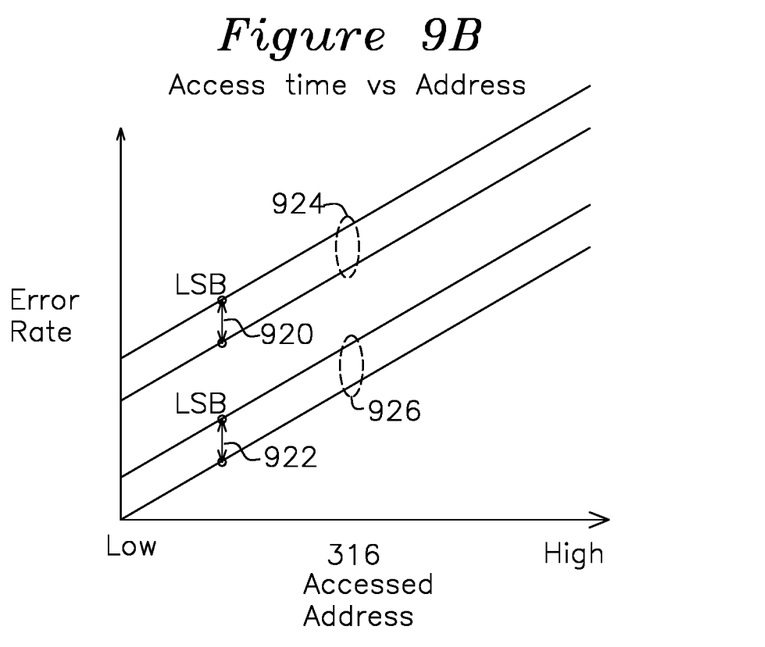
FIG. 9B is a plot of access time vs address for a first error rate and a second error rate.

FIG. 9B shows the access time vs address for two example error rate selections for the controller of FIG. 8A or 8B, plot group 924 being a higher error rate and longer wordline path length (with MSB bitlines of the lower plot having shorter path lengths as described earlier), and plot group 926 similarly for lower error rate.

The present examples are provided for illustrative purposes only, and are not intended to limit the invention to only the embodiments shown.

We claim:

1. A memory device comprising:
a wordline controller configured to activate a wordline with a pulse width determined by one or more significant bits of an applied address in combination with at least two desired data error rates;
at least one memory array arranged as a sequence of columns of data, each column of data activated by an associated wordline, the activated wordline causing data from a column of memory cells associated with the wordline to be asserted to bitlines coupled to an input/output driver;
the wordline controller configured to cause an associated wordline pulse width to be longer for an address value which has a longer associated wordline than an address value which has a comparatively shorter associated wordline.

2. The memory device of claim 1 where the at least one memory array comprises a top memory cell array and a bottom memory cell array.

3. The memory device of claim 1 where the at least one memory array is configured to provide a high value address a greater distance from the wordline controller than a low value address.

4. The memory device of claim 1 where the at least one memory array is configured to have a wordline signal path length which is shorter for a memory array data most significant bit (MSB) than for a memory array data least significant bit (LSB) for a column of data.

5. The memory device of claim 1 where the bitlines are configured to output multiples of 8 bits of data.

6. The memory device of claim 1 where the bitlines are configure to output 32 bits of data arranged as four eight bit bytes which are individually selectable as output data.

7. The memory device of claim 1 where the at least two desired data error rates include a higher data error rate and a lower data error rate selected from: an error rate of approximately 10% MSB data errors, an error rate of approximately 1% MSB data errors, an error rate of approximately 0.1% MSB data errors, and an error rate of less than 0.00034% MSB data errors.

8. The memory device of claim 7 where for a given data error rate and a given address, the MSB data error rate is less than a corresponding LSB data error rate.

9. The memory device of claim 1 where the at least two data error rates are selected from: a high error rate of 2% to 15% MSB data error rate, a medium error rate of 0.5% to 2% MSB data error rate, a low error rate of 0.005% to 0.5% MSB data error rate, and very low error rate of less than 0.00034% data errors.

10. A memory array comprising:
a top memory cell array accessed by activating a wordline which causes the top memory cell array to output data onto one or more bitlines;
a bottom memory cell array accessed by activating a wordline which causes bottom memory cell array to output data onto one or more bitlines;
a wordline controller configured to examine output data from the one or more bitlines and one or more most significant bits of an applied address, the wordline controller modifying a wordline pulse width until one of four error rates occurs:
a high error rate where a most significant bit (MSB) of data in a particular memory cell has an error rate in the range of 2% to 15%, or approximately 10%;
a moderate error rate where the MSB of data in the particular memory cell has an error rate in the range of 0.5% to 2%, or approximately 1%;
a low error rate where the MSB of data in the particular memory cell has an error rate in the range of 0.005% to 0.5%, or approximately 0.1%; and
a very low error rate where the MSB of data in the particular memory cell has an error rate less than 0.00034%;
and where a selected data error rate is maintained over an available applied address range.

11. The memory device of claim 10 where the at least one memory array is configured to provide a high value address a greater distance from the wordline controller than a low value address.

12. The memory device of claim 10 where the at least one memory array is configured to have a wordline signal path length which is shorter for a most significant bit (MSB) than a wordline signal path length for a least significant bit (LSB) for a column of data.

13. The memory device of claim 10 where the one or more bitlines comprise multiples of 8 bits of data.

14. The memory device of claim 10 where the one or more bitlines provide 32 bits of data arranged as four eight bit bytes which are individually selectable as output data.

15. The memory device of claim 10 where the four error rates include error rates of approximately 10% MSB errors, approximately 1% MSB errors, approximately 0.1% MSB errors, and less than 0.00034% MSB errors.

16. The memory device of claim 10 where for a given error rate and a given address, the MSB data error rate is less than a corresponding LSB data error rate.

17. The memory device of claim 10 where the four error rates are a high error rate of 2% to 15% MSB error rate, a medium error rate of 0.5% to 2% MSB error rate, a low error rate of 0.005% to 0.5%, and very low error rate of less than 0.00034% error rate.

* * * * *